(12) United States Patent
Cheng et al.

(10) Patent No.: US 12,293,912 B2
(45) Date of Patent: May 6, 2025

(54) GROUP III NITRIDE STRUCTURES AND MANUFACTURING METHODS THEREOF

(71) Applicant: ENKRIS SEMICONDUCTOR, INC., Suzhou (CN)

(72) Inventors: Kai Cheng, Suzhou (CN); Weihua Liu, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 17/434,543

(22) PCT Filed: May 12, 2020

(86) PCT No.: PCT/CN2020/089836
§ 371 (c)(1),
(2) Date: Aug. 27, 2021

(87) PCT Pub. No.: WO2021/226839
PCT Pub. Date: Nov. 18, 2021

(65) Prior Publication Data
US 2023/0053953 A1    Feb. 23, 2023

(51) Int. Cl.
H01L 21/02    (2006.01)
H01L 33/00    (2010.01)
H10H 20/01    (2025.01)

(52) U.S. Cl.
CPC .... *H01L 21/02458* (2013.01); *H01L 21/0254* (2013.01); *H01L 21/02639* (2013.01); *H10H 20/0137* (2025.01)

(58) Field of Classification Search
CPC ........... H01L 21/02647; H01L 33/0066; H01L 21/0265; H01L 21/02458; H01L 21/0254;
(Continued)

(56) References Cited

U.S. PATENT DOCUMENTS

| 8,492,185 B1 * | 7/2013 | D'Evelyn | ......... H01L 21/02642 438/22 |
| 2001/0020440 A1 * | 9/2001 | Morita | .............. H01L 21/02647 257/E21.127 |

(Continued)

FOREIGN PATENT DOCUMENTS

| CN | 101378017 A | 3/2009 |
| CN | 102427100 A | 4/2012 |

(Continued)

OTHER PUBLICATIONS

CN 106409901 A merged/translated (Year: 2017).*
(Continued)

*Primary Examiner* — Mary A Wilczewski
*Assistant Examiner* — Nathan Pridemore
(74) *Attorney, Agent, or Firm* — Getech Law LLC; Jun Ye

(57) ABSTRACT

A group-III-nitride structure and a manufacturing method thereof are provided. In the manufacturing method, one or more grooves are formed by etching a first group-III-nitride epitaxial layer with a patterned first mask layer as a mask; then a second mask layer is formed at least on one or more bottom walls of the one or more grooves, and a first epitaxial growth is performed on the first group-III-nitride epitaxial layer to laterally grow and form a second group-III-nitride epitaxial layer with the second mask layer as a mask, where the one or more grooves are filled with the second group III-nitride epitaxial layer; a second epitaxial growth is then performed on the second group-III-nitride epitaxial layer to grow and form a third group-III-nitride epitaxial layer on the second group-III-nitride epitaxial layer and the patterned first mask layer.

19 Claims, 5 Drawing Sheets

(58) Field of Classification Search
CPC .............. H01L 21/02639; H01L 33/16; H01L 33/0075; H01L 21/02502; C30B 25/04; C30B 25/20; C30B 25/02–22; C30B 29/403; H10H 20/0137; H10H 20/0133; H10D 30/875; A61K 40/4536
See application file for complete search history.

(56) References Cited

U.S. PATENT DOCUMENTS

| | | | |
|---|---|---|---|
| 2001/0039102 A1 | 11/2001 | Zheleva et al. | |
| 2004/0183078 A1* | 9/2004 | Wang | H01L 21/02639 |
| | | | 257/E21.127 |
| 2020/0224331 A1* | 7/2020 | D'Evelyn | C30B 25/20 |

FOREIGN PATENT DOCUMENTS

| | | | | |
|---|---|---|---|---|
| CN | 103247517 A | | 8/2013 | |
| CN | 103413776 A | | 11/2013 | |
| CN | 106409901 A | * | 2/2017 | ....... H01L 29/66462 |
| CN | 109920727 A | | 6/2019 | |
| JP | 2009267412 A | * | 11/2009 | ......... H01L 21/0237 |

OTHER PUBLICATIONS

Translated/Merged JP 2009267412 (Year: 2009).*
PCT/CN2020/089836—Written Opinion, mailed Feb. 10, 2021, 5 pages. (with English translation).
PCT/CN2020/089836—International Search Report, mailed Feb. 22, 2021, 4 pages.

* cited by examiner

GROUP III NITRIDE STRUCTURES AND MANUFACTURING METHODS THEREOF

CROSS REFERENCE TO RELATED APPLICATION

This application is a US National Phase of a PCT Application No. PCT/CN2020/089836, filed on May 12, 2020, the contents of which are incorporated herein by reference in its entirety.

TECHNICAL FIELD

The present application relates to a field of semiconductor technology, and in particular, to group-III-nitride structures and manufacturing methods thereof.

BACKGROUND

Group-III-nitride is a third-generation new semiconductor material subsequent to first and second-generation semiconductor materials such as Si, GaAs, etc. GaN, as a wide bandgap semiconductor material, has many advantages, such as high saturation drift speed, large breakdown voltage, excellent carrier transportation performance, capability of forming AlGaN, InGaN ternary alloy, AlInGaN quaternary alloy, etc., and a GaN-based PN junction can be easily manufactured. In view of this, in recent years, GaN-based materials and semiconductor devices have gained extensive and intensive studies, and growing GaN-based materials by Metal-organic Chemical Vapor Deposition (MOCVD) technology has evolved. In terms of research on semiconductor devices, research on photoelectronic devices such as GaN-based LEDs and LDs and microelectronic devices such as GaN-based HEMTs have made significant achievements and rapid progress.

As the application of the GaN-based materials to power devices/display devices gradually deepens, requirement of terminal products on a dislocation density of the GaN-based materials is further increased, and the dislocation density of the GaN-based material epitaxially grown on the mainstream GaN-based epitaxial substrate aluminum trioxide (Al2O3) substrate using the mainstream MOCVD epitaxial equipment in the traditional mode is about 1-3E8/cm^3. In order to manufacture higher voltage resistant GaN-based power devices and longer band GaN-based LEDs, the dislocation density of the GaN-based materials should be further reduced.

In view of this, it is indeed necessary to provide a new group-III-nitride structure and a manufacturing method thereof, so as to satisfy the above requirements.

SUMMARY

An object of the present disclosure is to provide group-III-nitride structures and manufacturing methods thereof, which reduce the dislocation density of the group-III-nitride material and improve the performance of the group-III-nitride semiconductor devices.

In order to achieve the above object, a first aspect of the present disclosure provides a method of manufacturing a group-III-nitride structure, including:
providing a first group-III-nitride epitaxial layer; forming a patterned first mask layer on the first group-III-nitride epitaxial layer; and etching the first group-III-nitride epitaxial layer to form one or more grooves with the patterned first mask layer as a mask;
forming a second mask layer at least on one or more bottom walls of the one or more grooves; and laterally growing and forming a second group-III-nitride epitaxial layer by performing a first epitaxial growth on the first group-III-nitride epitaxial layer with the second mask layer as a mask, where the one or more grooves are filled with the second group-III-nitride epitaxial layer; and
growing and forming a third group-III-nitride epitaxial layer on the second group-III-nitride epitaxial layer and the patterned first mask layer by performing a second epitaxial growth on the second group-III-nitride epitaxial layer.

It should be noted that the lateral direction in the present disclosure refers to a direction vertical to a thickness direction of the first group-III-nitride epitaxial layer.

Optionally, the first group-III-nitride epitaxial layer is located on a substrate, the one or more bottom walls of the one or more grooves expose the substrate, and the substrate serves as the second mask layer.

Optionally, the second mask layer is further formed on the patterned first mask layer, and the third group-III-nitride epitaxial layer is grown and formed on the second mask layer.

Optionally, a material of the first mask layer includes at least one of silicon dioxide or silicon nitride; and/or a material of the second mask layer includes at least one of silicon dioxide or silicon nitride.

Optionally, a material of the first group-III-nitride epitaxial layer, a material of the second group-III-nitride epitaxial layer and a material of the third group-III-nitride epitaxial layer is the same, and includes at least one of GaN, AlN, AlGaN, InGaN or AlInGaN.

Optionally, processes for the epitaxial growth of the second group-III-nitride epitaxial layer and/or the third group-III-nitride epitaxial layer include at least one of an atomic layer deposition method, a chemical vapor deposition method, a molecular beam epitaxial growth method, a plasma enhanced chemical vapor deposition method, a low pressure chemical vapor deposition method, or a metal organic compound chemical vapor deposition method.

Optionally, the processes for the epitaxial growth of the second group-III-nitride epitaxial layer and the third group-III-nitride epitaxial layer are the metal organic compound chemical vapor deposition method; and forming the second mask layer, and growing the second group-III-nitride epitaxial layer and the third group-III-nitride epitaxial layer are performed in a same metal organic compound chemical vapor deposition device.

Optionally, etching to form the one or more grooves, forming the second mask layer, and growing the second group-III-nitride epitaxial layer and the third group-III-nitride epitaxial layer are performed in the same metal organic compound chemical vapor deposition apparatus.

Optionally, when the third group-III-nitride epitaxial layer on the patterned first mask layer is not coalesced, further growing and forming a fourth group-III-nitride epitaxial layer on the patterned first mask layer and the third group-III-nitride epitaxial layer.

Optionally, the method further includes: growing an LED structure on the fourth group-III-nitride epitaxial layer.

Optionally, the method further includes: growing an LED structure on the third group-III-nitride epitaxial layer.

Optionally, a method of forming the first group-III-nitride epitaxial layer includes: epitaxially growing the first group-III-nitride epitaxial layer on a substrate.

Optionally, the substrate includes at least one of sapphire, silicon carbide or silicon.

A second aspect of the present disclosure provides a group-III-nitride structure, including:
- a first group-III-nitride epitaxial layer, where a patterned first mask layer is located on the first group-III-nitride epitaxial layer;
- a second group-III-nitride epitaxial layer extending into the first group-III-nitride epitaxial layer from one or more openings of the patterned first mask layer, where a second mask layer is provided between a bottom wall of the second group-III-nitride epitaxial layer and the first group-III-nitride epitaxial layer, and a sidewall of the second group-III-nitride epitaxial layer is connected with the first group-III-nitride epitaxial layer; and
- a third group-III-nitride epitaxial layer located on the second group-III-nitride epitaxial layer and the patterned first mask layer, wherein [0001] crystal orientations of the first group-III-nitride epitaxial layer (11), the second group-III-nitride epitaxial layer (14) and the third group-III-nitride epitaxial layer (15) are parallel to a thickness direction.

Optionally, a material of the first group-III-nitride epitaxial layer, a material of the second group-III-nitride epitaxial layer and a material of the third group-III-nitride epitaxial layer are the same, and include at least one of GaN, AlN, AlGaN, InGaN or AlInGaN.

Optionally, the method further includes: a substrate, wherein the first group-III-nitride epitaxial layer is located on the substrate.

Optionally, the substrate serves as the second mask layer.

Optionally, the substrate includes at least one of sapphire, silicon carbide or silicon.

Optionally, the patterned first mask layer further has the second mask layer located thereon, and the third group-III-nitride epitaxial layer is located on the second mask layer.

Optionally, a material of the first mask layer includes at least one of silicon dioxide or silicon nitride; and/or a material of the second mask layer includes at least one of silicon dioxide or silicon nitride.

Optionally, the second group-III-nitride epitaxial layer is an in-situ second group-III-nitride epitaxial layer; and/or the second mask layer is an in-situ second mask layer.

Optionally, the third group-III-nitride epitaxial layer located on the patterned first mask layer is not coalesced, and the third group-III-nitride epitaxial layer has a fourth group-III-nitride epitaxial layer located thereon.

Optionally, the method further includes: an LED structure located on the fourth group-III-nitride epitaxial layer.

Optionally, the method further includes: an LED structure located on the third group-III-nitride epitaxial layer.

Compared with the prior art, the present disclosure has the following beneficial effects.

1) In the method of manufacturing a group-III-nitride structure of the present disclosure, a patterned first mask layer serves as a mask, one or more grooves are formed by etching a first group-III-nitride epitaxial layer; then a second mask layer is formed at least on one or more bottom walls of the one or more grooves, and a second group-III-nitride epitaxial layer is formed by performing a first epitaxial growth on the first group-III-nitride epitaxial layer with the second mask layer as a mask, where the one or more grooves are filled with the second group-III-nitride epitaxial layer; a third group-III-nitride epitaxial layer is grown and formed on the second group-III-nitride epitaxial layer and the patterned first mask layer by performing a second epitaxial growth on the second group-III-nitride epitaxial layer. Since the dislocation of the first group-III-nitride epitaxial layer is mainly a linear dislocation in the crystal orientation, that is, a dislocation extending in the thickness direction of the first group-III-nitride epitaxial layer, the first epitaxial growth with the growth direction being lateral growth direction can block the dislocation from continuing to extend upward, thereby significantly reducing the dislocation density of the second group-III-nitride epitaxial layer and the third group-III-nitride epitaxial layer.

2) In an optional solution, the first group-III-nitride epitaxial layer is located on the substrate, and a) a part of thickness of the first group-III-nitride epitaxial layer is etched to form one or more grooves; or b) an entire thickness of the first group-III-nitride epitaxial layer is etched to form one or more grooves. In the b) solution, since the bottom wall of the one or more grooves expose the substrate, the manufacturing process of the second mask layer can be omitted, and the substrate serves as the second mask layer.

3) In an optional solution, the second mask layer is further formed on the patterned first mask layer, and the third group-III-nitride epitaxial layer is grown and formed on the second mask layer. The advantage of the present solution with respect to the solution of forming the second mask layer 13 only on the one or more bottom walls of the one or more grooves is that the patterning process of the second mask layer can be omitted, and the process is simplified. This is because, in the process of serving the patterned first mask layer as a mask and forming one or more grooves by etching the first group-III-nitride epitaxial layer, not only part of the material is removed in the thickness direction, but also part of the material is removed in the lateral direction by etching, in other words, the patterned first mask layer has a suspended section at the one or more groove openings; when depositing the second mask layer, the suspended section blocks the second mask layer, so that the second mask layer are only deposited on the patterned first mask layer outside the one or more grooves and the one or more bottom walls of the one or more grooves, thereby avoiding forming the second mask layer on the sidewall of the groove.

4) In an optional solution, a) a material of the first group-III-nitride epitaxial layer, a material of the second group-III-nitride epitaxial layer and a material of the third group-III-nitride epitaxial layer are the same, or b) at least two of the material of the first group-III-nitride epitaxial layer, the material of the second group-III-nitride epitaxial layer or the material of the third group-III-nitride epitaxial layer are different. The materials of the first group-III-nitride epitaxial layer, and/or the second group-III-nitride epitaxial layer, and/or the third group-III-nitride epitaxial layer can include at least one of GaN, AlN, AlGaN, InGaN, or AlInGaN. The specific materials of the first group-III-nitride epitaxial layer, the second group-III-nitride epitaxial layer and the third group-III-nitride epitaxial layer can be determined according to functions, and the specific functions can include: a substrate, a buffer layer, a barrier layer, or a channel layer in the device.

5) In an optional solution, the processes for the epitaxial growth of the second group-III-nitride epitaxial layer and the third group-III-nitride epitaxial layer are the metal organic compound chemical vapor deposition method; forming the second mask layer, and growing the second group-III-nitride epitaxial layer and the third group-III-nitride epitaxial layer are performed in a same metal organic compound chemical vapor deposition device (MOCVD device). In other words, the second group-III-nitride epitaxial layer is an in-situ second group-III-nitride epitaxial layer, and the third group-III-nitride epitaxial layer is an in-situ third group-III-nitride epitaxial layer. The advantages of in-situ process are that the process complexity can be reduced, the transfer process of a plurality of processes between different devices can be reduced, and the contamination source is avoided to participate processes interfering with the quality of the group-III-nitride epitaxial layer and the group-III-nitride epitaxial layer.

Further, etching to form the one or more grooves, forming the second mask layer, and growing the second group-III-nitride epitaxial layer and the third group-III-nitride epitaxial layer are performed in the same MOCVD device. In other words, the second mask layer is an in-situ second mask layer. In the groove etching process, the reactive gas in the MOCVD device can include $Cl_2$ and $BCl_3$. The mixed gas can chemically react with the first group-III-nitride epitaxial layer to form a groove.

6) In an optional solution, when the third group-III-nitride epitaxial layer on the patterned first mask layer is not coalesced, a fourth group-III-nitride epitaxial layer is further grown and formed on the patterned first mask layer and the third group-III-nitride epitaxial layer. When the material of the fourth group-III-nitride epitaxial layer is different from the material of the third group-III-nitride epitaxial layer, with the present solution, stresses in the fourth group-III-nitride epitaxial layer can be effectively released, and dislocations and V-type pits in the fourth group-III-nitride epitaxial layer can be reduced.

7) In an optional solution, an LED structure is further formed on the third group-III-nitride epitaxial layer or the fourth group-III-nitride epitaxial layer. The LED structure can include an N-type semiconductor layer, a P-type semiconductor layer, and a quantum well layer located between the N-type semiconductor layer and the P-type semiconductor layer. In other words, the first group-III-nitride epitaxial layer, the second group-III-nitride epitaxial layer and the third group-III-nitride epitaxial layer serve as substrates of the LED structure, or the first group-III-nitride epitaxial layer, the second group-III-nitride epitaxial layer, the third group-III-nitride epitaxial layer and the fourth group-III-nitride epitaxial layer serve as the substrates of the LED structure, and a green LED, a yellow LED, a red LED, and even an infrared LED can be manufactured.

Figure 1:
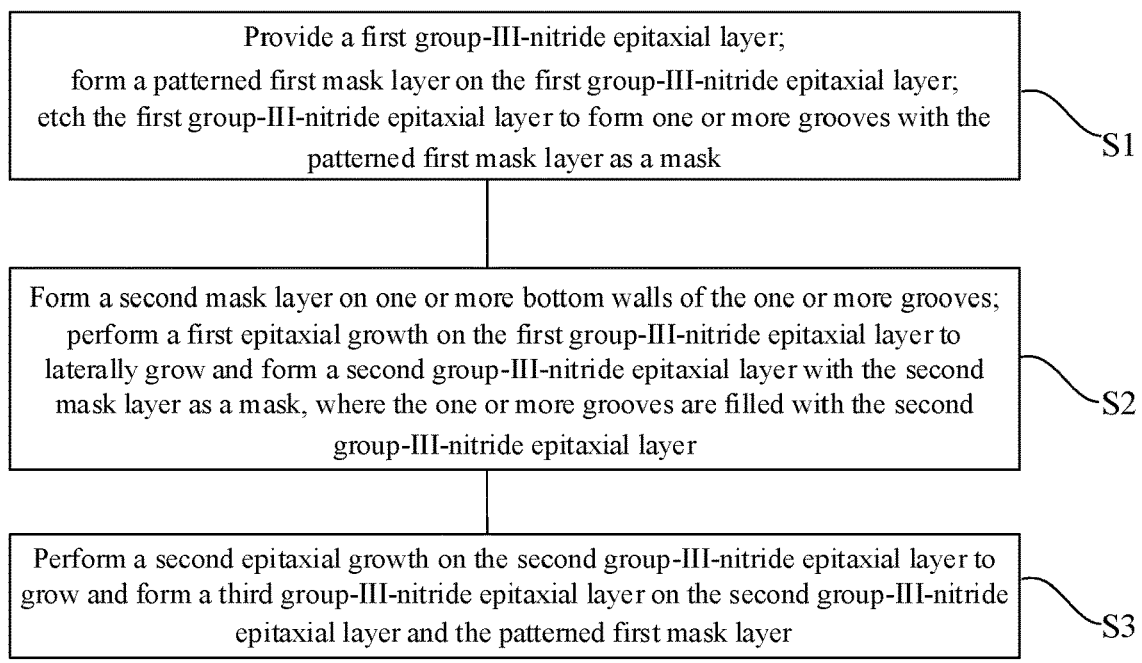
FIG. 1 is a flowchart of a method of manufacturing a group-III-nitride structure according to a first embodiment of the present disclosure.

To facilitate the understanding of the present disclosure, all reference signs present in the present disclosure are listed below:

| | |
|---|---|
| First group-III-nitride epitaxial layer 11 | Patterned first mask layer 12 |
| Groove 11a | Substrate 10 |
| Second mask layer 13 | In-situ second mask layer 13' |
| Second group-III-nitride epitaxial layer 14 | In-situ second group-III-nitride epitaxial layer 14' |
| Third group-III-nitride epitaxial layer 15 | In-situ third group-III-nitride epitaxial layer 15' |
| Fourth group III nitride epitaxial layer 16 | LED structure 17 |
| Group-III-nitride structures 1, 2, 3, 4, 5, 6, 7 | |

DETAILED DESCRIPTION OF THE EMBODIMENTS

In order to make the above objects, features and advantages of the present disclosure more apparent, specific embodiments of the present disclosure will be described in detail below with reference to the accompanying drawings.

Figure 2:
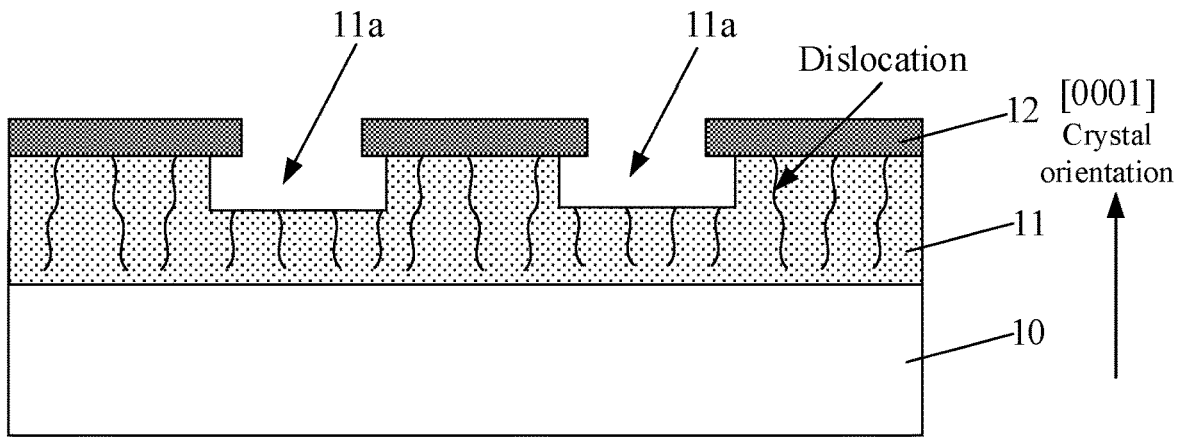
FIGS. 2 to 4 are schematic views illustrating intermediate structures corresponding to the flow in FIG. 1.
Figure 3:
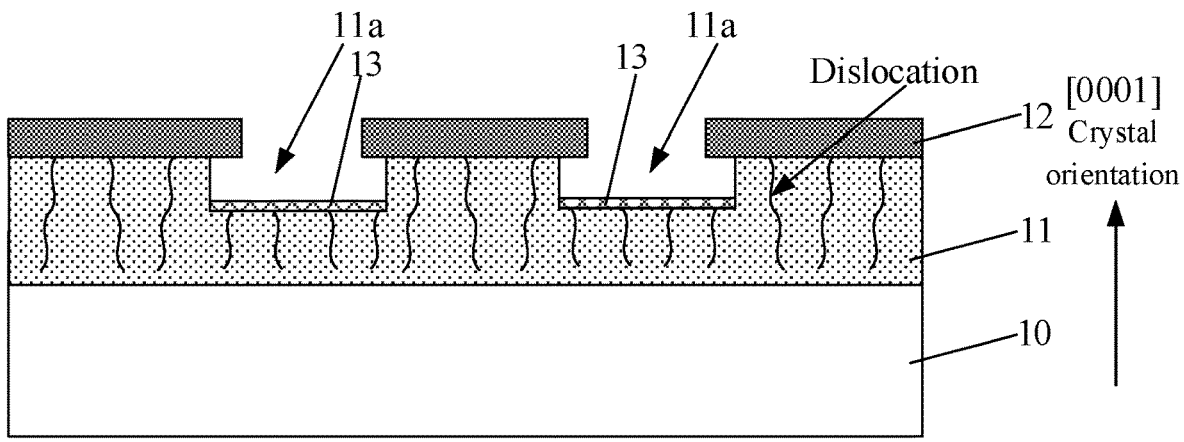
Figure 4:
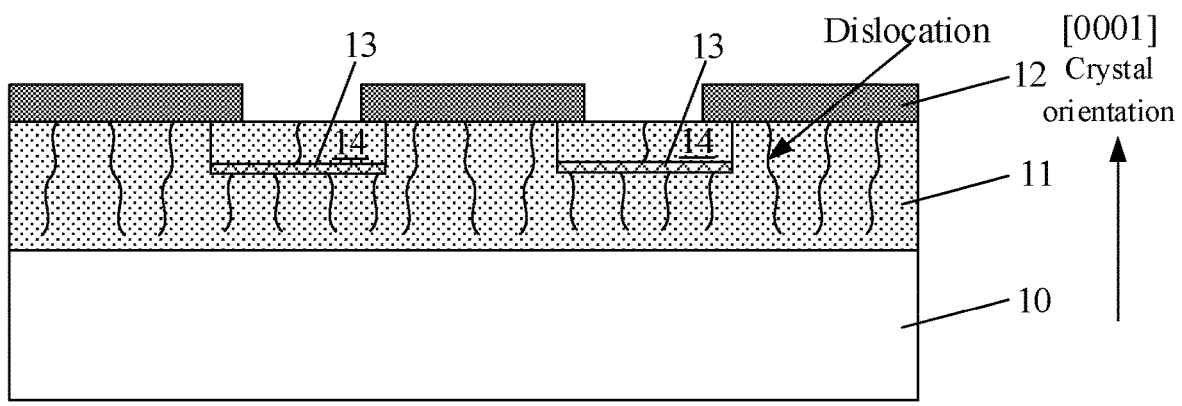
Figure 5:
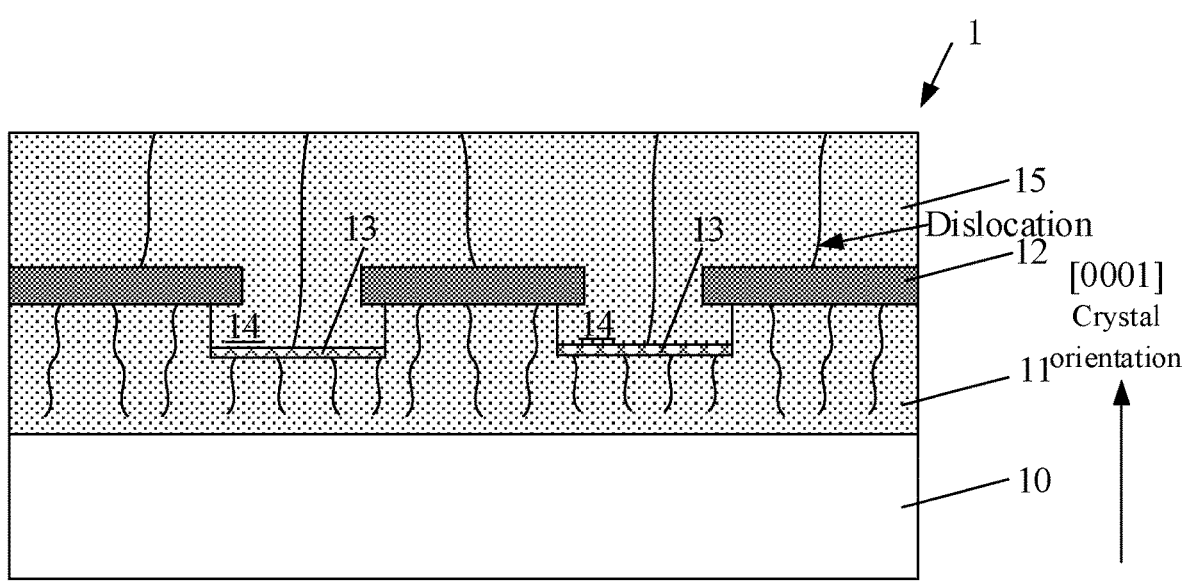
FIG. 5 is a schematic cross-sectional view illustrating a group-III-nitride structure according to a first embodiment of the present disclosure.

FIG. 1 is a flowchart of a method of manufacturing a group-III-nitride structure according to a first embodiment of the present disclosure. FIGS. 2 to 4 are schematic views illustrating intermediate structures corresponding to the flow in FIG. 1. FIG. 5 is a schematic cross-sectional view illustrating a group-III-nitride structure according to a first embodiment of the present disclosure.

First, referring to step S1 in FIG. 1 and FIG. 2, a first group-III-nitride epitaxial layer 11 is provided; a patterned first mask layer 12 is formed on the first group-III-nitride epitaxial layer 11; and the first group-III-nitride epitaxial layer 11 is etched to form one or more grooves 11a with the patterned first mask layer 12 as a mask.

Referring to FIG. 2, in the present embodiment, the first group-III-nitride epitaxial layer 11 can be formed on a substrate 10. The substrate 10 can be at least one of sapphire, silicon carbide, or silicon, which is not limited in this embodiment.

A group-III-nitride material of the first group-III-nitride epitaxial layer 11 can be AlN, or at least one of GaN, AlGaN, InGaN, or AlInGaN, which is not limited in this embodiment. The AlN can be used as a nucleation layer. The first group-III-nitride epitaxial layer 11 has a dislocation, and the dislocation is mainly a linear dislocation in the [0001] crystal orientation, that is, the dislocation extends in a thickness direction of the first group-III-nitride epitaxial layer 11.

At step S1, the first group-III-nitride epitaxial layer 11 formed on the substrate 10 can be of an existing structure, or step S1 can include: epitaxially growing the first group-III-nitride epitaxial layer 11 on the substrate 10.

The formation process of the first group-III-nitride epitaxial layer 11 can include: an atomic layer deposition method (ALD), or a chemical vapor deposition method (CVD), or a molecular beam epitaxy method (MBE), or a plasma enhanced chemical vapor deposition method (PECVD), or a low pressure chemical vapor deposition method (LPCVD), or a metal organic compound chemical vapor deposition method, or a combination thereof.

In some embodiments, the first group-III-nitride epitaxial layer 11 after peeling off the substrate 10 can be the first group-III-nitride epitaxial layer 11 in step S1.

A material of the first mask layer 12 can include at least one of silicon dioxide or silicon nitride.

In the present embodiment, the first group-III-nitride epitaxial layer 11 can be etched by dry etching or by wet etching.

The dry etching can be an inductively coupled plasma etching (ICP). The etching gas can include $Cl_2$ and $BCl_3$. In the dry etching, since the plasma of the etching gas not only chemically reacts with the group-III-nitride material to be etched in the thickness direction, but also chemically reacts with the group-III-nitride material to be etched in a direction which is vertical to the thickness direction, that is, in a lateral direction, after the etching is completed, part of the patterned first mask layer 12 forms a suspended section at the one or more openings of the one or more grooves 11a.

The etchant of wet etching can be a $H_3PO_4$ solution or a KOH solution, which is corrosive on the N-side. GaN crystal has a wurtzite structure, in which Ga and N atomic layers are stacked as ABABAB hexagonal layer stacking manner, and each Ga(N) atom is bonded with the surrounding four N(Ga) atoms as a diamond-like tetrahedral structure. Taking a Ga—N bond parallel to a C-axis ([0001] crystal orientation) as a reference, and if the Ga atom in each Ga—N bond is farther away from a lower side, an upper side is a Ga-side; if the N atom in each Ga—N bond is farther away from the lower side, the upper side is an N-side. In this embodiment, the upper side of the first group-III-nitride epitaxial layer 11 can be controlled to be the N-side.

In the wet etching, since the etchant not only chemically reacts with the group-III-nitride material to be etched in the thickness direction, but also chemically reacts with the group-III-nitride material to be etched in the lateral direction, after the etching is completed, part of the patterned first mask layer 12 also forms a suspended section at the one or more openings of the one or more grooves 11a.

In the present embodiment, as shown in FIG. 2, the one or more grooves 11a are formed by etching a part of thickness of the first group-III-nitride epitaxial layer 11.

Next, still referring to step S2 in FIG. 1 and FIG. 3, a second mask layer 13 is formed on one or more bottom walls of the one or more grooves 11a. Referring to FIG. 4, a first epitaxial growth is performed on the first group-III-nitride epitaxial layer 11 to laterally grow and form a second group-III-nitride epitaxial layer 14 with the second mask layer 13 as a mask, and the second group-III-nitride epitaxial layer 14 fills the one or more grooves 11a.

A material of the second mask layer 13 can include at least one of silicon dioxide or silicon nitride, and the forming method can include a physical vapor deposition method or a chemical vapor deposition method. Since the patterned first mask layer 12 has a suspended section at the one or more openings of the one or more grooves 11a, and when depositing the second mask layer 13, the suspended section blocks the second mask layer 13, so that the second mask layer 13 is deposited only on the patterned first mask layer 12 outside the one or more grooves 11a and on the one or more bottom walls of the one or more grooves 11a, thereby avoiding deposition on one or more sidewalls of the one or more grooves 11a.

Referring to FIG. 3, in the present embodiment, only the second mask layer 13 on the one or more bottom walls of the one or more grooves 11a is retained. The second mask layer 13 outside the one or more grooves 11a can be removed by dry etching. For example, a photoresist is arranged on the second mask layer 13, and a patterned photoresist after exposure and development exposes the second mask layer 13 outside the one or more grooves 11a.

Referring to FIG. 4, since the second mask layer 13 blocks the first group-III-nitride epitaxial layer 11 on the one or more bottom walls of the one or more grooves 11a, a first epitaxial growth of the first group-III-nitride epitaxial layer 11 cannot be realized in the thickness direction and can only be realized in the lateral direction. The dislocation of the first group-III-nitride epitaxial layer 11 is mainly a dislocation extending in the thickness direction, and thus lateral growth can block the dislocation in the thickness direction from continuing to extend upward, thereby significantly reducing the dislocation density of the second group-III-nitride epitaxial layer 14.

The material of the second group-III-nitride epitaxial layer 14 can be the same as or different from the material of the first group-III-nitride epitaxial layer 11. The material of the second group-III-nitride epitaxial layer 14 can be at least one of GaN, AlN, AlGaN, InGaN, or AlInGaN, which is not limited in this embodiment.

The formation process of the second group-III-nitride epitaxial layer 14 can refer to the formation process of the first group-III-nitride epitaxial layer 11.

Subsequently, still referring to step S3 in FIG. 1 and FIG. 5, a second epitaxial growth is performed on the second group-III-nitride epitaxial layer 14 to grow and form a third group-III-nitride epitaxial layer 15 on the second group-III-nitride epitaxial layer 14 and the patterned first mask layer 12.

The second epitaxial growth includes growth in the lateral and thickness directions.

A material of the third group-III-nitride epitaxial layer 15 can be the same as or different from the material of the second group-III-nitride epitaxial layer 14. The material of the third group-III-nitride epitaxial layer 15 can be at least one of GaN, AlGaN, InGaN, or AlInGaN, which is not limited in this embodiment.

A function of the third group-III-nitride epitaxial layer 15 can be the same as or different from a function of the second group-III-nitride epitaxial layer 14 or a function of the first group-III-nitride epitaxial layer 11. For example, the first group-III-nitride epitaxial layer 11 and the second group-III-nitride epitaxial layer 14 can be substrates in a device, and the third group-III-nitride epitaxial layer 15 can be a buffer layer, a barrier layer or a channel layer in the device. The buffer layer can reduce a threaded dislocation (TD) density in an upper semiconductor layer and a TD bending due to the lateral growth mechanism. For another example, the first group-III-nitride epitaxial layer 11 and the second group-III-nitride epitaxial layer 14 can be a buffer layer in the device, and the third group-III-nitride epitaxial layer 15 can be a barrier layer or a channel layer in the device; or the first group-III-nitride epitaxial layer 11, the second group-III-nitride epitaxial layer 14 and the third group-III-nitride epitaxial layer 15 are all substrates, buffer layers, barrier layers or channel layers in the device.

FIG. 5 is a schematic cross-sectional view illustrating a group-III-nitride structure according to a first embodiment of the present disclosure.

As shown in FIG. 5, the group-III-nitride structure 1 of the present embodiment includes:

a first group-III-nitride epitaxial layer 11, where a patterned first mask layer 12 is located on the first group-III-nitride epitaxial layer 11;

a second group-III-nitride epitaxial layer 14 extending into the first group-III-nitride epitaxial layer 11 from one or more openings of the patterned first mask layer 12, where a second mask layer 13 is provided between a bottom wall of the second group-III-nitride epitaxial layer 14 and the first group-III-nitride epitaxial layer 11, and a side wall of the second group-III-nitride epitaxial layer 14 is connected with the first group-III-nitride epitaxial layer 11; and a third group-III-nitride epitaxial layer 15 located on the second group-III-nitride epitaxial layer 14 and the patterned first mask layer 12, where crystal orientations of the first group-III-nitride epitaxial layer 11, the second group-III-nitride epitaxial layer 14, and the third group-III-nitride epitaxial layer 15 are parallel to the thickness direction.

It can be seen that, since the second mask layer 13 blocks the first group-III-nitride epitaxial layer 11 on the bottom wall of the groove 11*a*, a first epitaxial growth of the first group-III-nitride epitaxial layer 11 cannot be realized in the thickness direction and can only be realized in the lateral direction. The dislocation of the first group-III-nitride epitaxial layer 11 is mainly a dislocation extending in the thickness direction, and thus lateral growth can block the dislocation in the thickness direction from continuing to extend upward, thereby significantly reducing the dislocation density of the second group-III-nitride epitaxial layer 14 and the dislocation density of the third group-III-nitride epitaxial layer 15.

The materials of the first group-III-nitride epitaxial layer 11, the second group-III-nitride epitaxial layer 14 and the third group-III-nitride epitaxial layer 15 can be the same or different. The material of the first group-III-nitride epitaxial layer 11, and/or the material of the second group-III-nitride epitaxial layer 14, and/or the material of the third group-III-nitride epitaxial layer 15 can be at least one of GaN, AlN, AlGaN, InGaN, or AlInGaN, which is not limited in this embodiment.

The function of the first group-III-nitride epitaxial layer 11, and/or the second group-III-nitride epitaxial layer 14, and/or the third group-III-nitride epitaxial layer 15 can be the same or different. The first group-III-nitride epitaxial layer 11, and/or the second group-III-nitride epitaxial layer 14, and/or the third group-III-nitride epitaxial layer 15 can be a substrate, a buffer layer, a barrier layer, or a channel layer in device.

The material of the second mask layer 13 can be a material inhibiting the growth of the first group-III-nitride epitaxial layer 11, for example, can include at least one of silicon dioxide or silicon nitride. The material of the first mask layer 12 can be selected from a material on which the second group-III-nitride epitaxial layer 14 can be attached, for example, can include at least one of silicon dioxide or silicon nitride.

In addition, referring to FIG. 5, in the present embodiment, the first group-III-nitride epitaxial layer 11 can be located on the substrate 10. The substrate 10 can be at least one of sapphire, silicon carbide, or silicon, which is not limited in this embodiment.

In some embodiments, the first group-III-nitride epitaxial layer 11 can be the first group-III-nitride epitaxial layer 11 with the substrate 10 peeled off.

Figure 6:
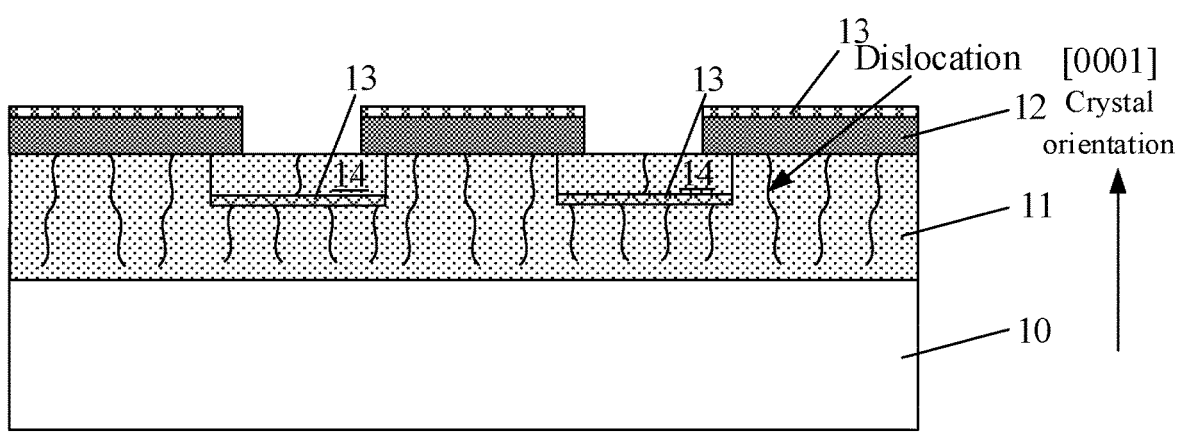
FIG. 6 is a schematic view illustrating an intermediate structure corresponding to a method of manufacturing a group-III-nitride structure according to a second embodiment of the present disclosure.
Figure 7:
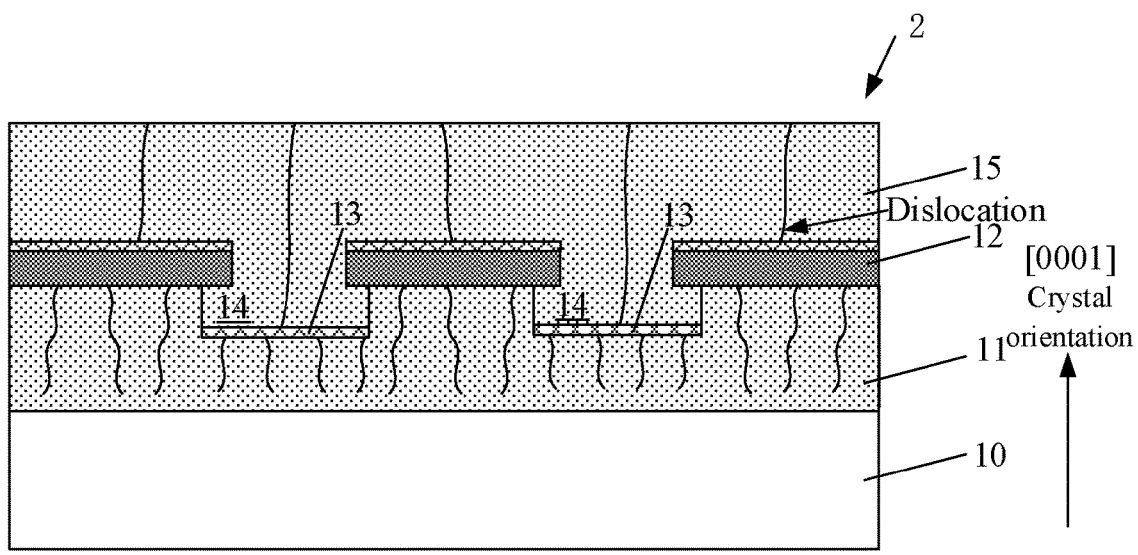
FIG. 7 is a schematic cross-sectional view illustrating a group-III-nitride structure according to a second embodiment of the present disclosure.

FIG. 6 is a schematic view illustrating an intermediate structure corresponding to a method of manufacturing a group-III-nitride structure according to a second embodiment of the present disclosure. FIG. 7 is a schematic cross-sectional view illustrating a group-III-nitride structure according to a second embodiment of the present disclosure. Referring to FIGS. 6 and 7, the group-III-nitride structure 2 and the manufacturing method thereof in the present embodiment are substantially the same as the group-III-nitride structure 1 and the manufacturing method thereof in the embodiments of FIGS. 1 to 5, and the difference merely lies in that the second mask layer 13 is further formed on the patterned first mask layer 12, and the third group-III-nitride epitaxial layer 15 is grown on the second mask layer 13.

The advantage of the present embodiment with respect to the solution of forming the second mask layer 13 only on the bottom walls of the one or more grooves 11*a* is that the patterning process of the second mask layer 13 can be omitted, and the process is simplified.

Figure 8:
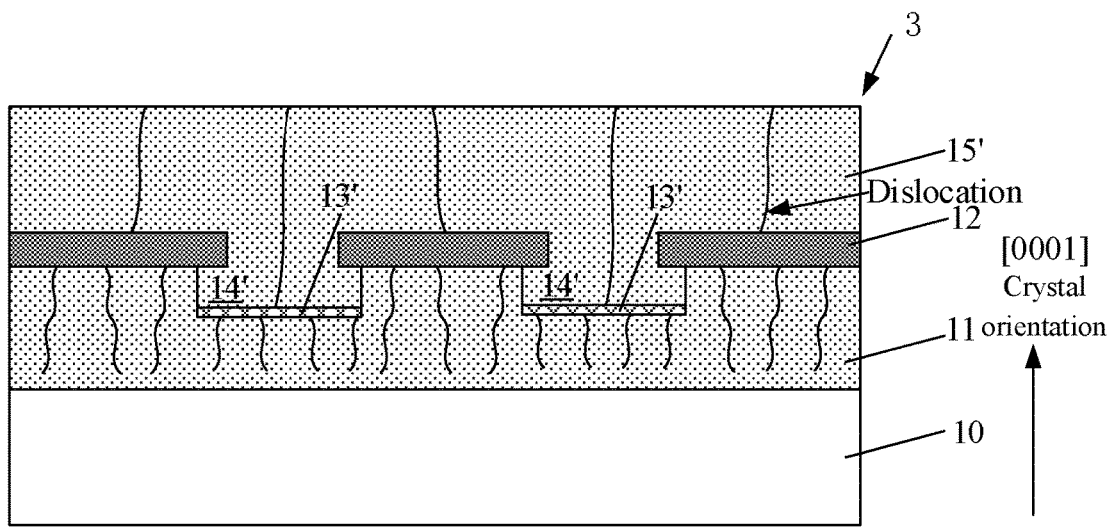
FIG. 8 is a schematic cross-sectional view illustrating a group-III-nitride structure according to a third embodiment of the present disclosure.

FIG. 8 is a schematic cross-sectional view illustrating a group-III-nitride structure according to a third embodiment of the present disclosure. Referring to FIG. 8, the group-III-nitride structure 3 of the present embodiment and the group-III-nitride structures 1 and 2 of the embodiments of FIGS. 1 and 7 are substantially the same, and the difference merely lies in that the second mask layer 13 is an in-situ second mask layer 13; the second group-III-nitride epitaxial layer is an in-situ second group-III-nitride epitaxial layer 14'; and the third group-III-nitride epitaxial layer 15 is an in-situ third group-III-nitride epitaxial layer 15'.

Correspondingly, a method of manufacturing the group-III-nitride structure 3 in the present embodiment is substantially the same as the methods of manufacturing the group-III-nitride structures 1 and 2 of the embodiments of FIGS. 1 to 5 and FIGS. 6 to 7, and the difference merely lies in that the etching to form the one or more grooves 11*a* in step S1, the forming of the second mask layer 13 and the growing of the second group-III-nitride epitaxial layer 14 in step S2, and the growing of the third group-III-nitride epitaxial layer 15 in step S3 are performed in the same MOCVD device.

In the etching process for the one or more grooves 11*a*, the reactive gas in the MOCVD device can include $Cl_2$ and $BCl_3$. The mixed gas can chemically react with the first group-III-nitride epitaxial layer 11 to form the one or more grooves 11*a*.

The advantages of in-situ processes, i.e., processes being performed in the same MOCVD device, are that the process complexity can be reduced, the transfer processes between different devices in a plurality of processes are reduced, and the contamination source is avoided to participate in the processes interfering with the quality of the second group-III-nitride epitaxial layer 14 and the third group-III-nitride epitaxial layer 15.

In some embodiments, the etching of the one or more grooves 11*a* can also be a dry etching or a wet etching of the foregoing embodiments. After the one or more grooves 11*a* are formed, the intermediate structure is transferred to the MOCVD device to form the second mask layer 13, and grow the second group-III-nitride epitaxial layer 14 and the third group-III-nitride epitaxial layer 15 in sequence.

Figure 9:
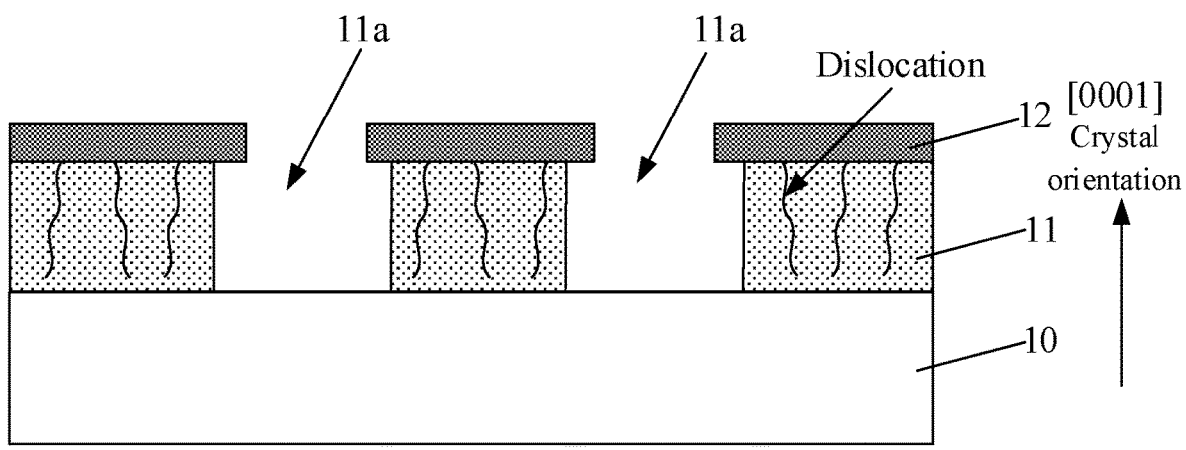
FIG. 9 is a schematic view illustrating an intermediate structure corresponding to a method of manufacturing a group-III-nitride structure according to a fourth embodiment of the present disclosure.
Figure 10:
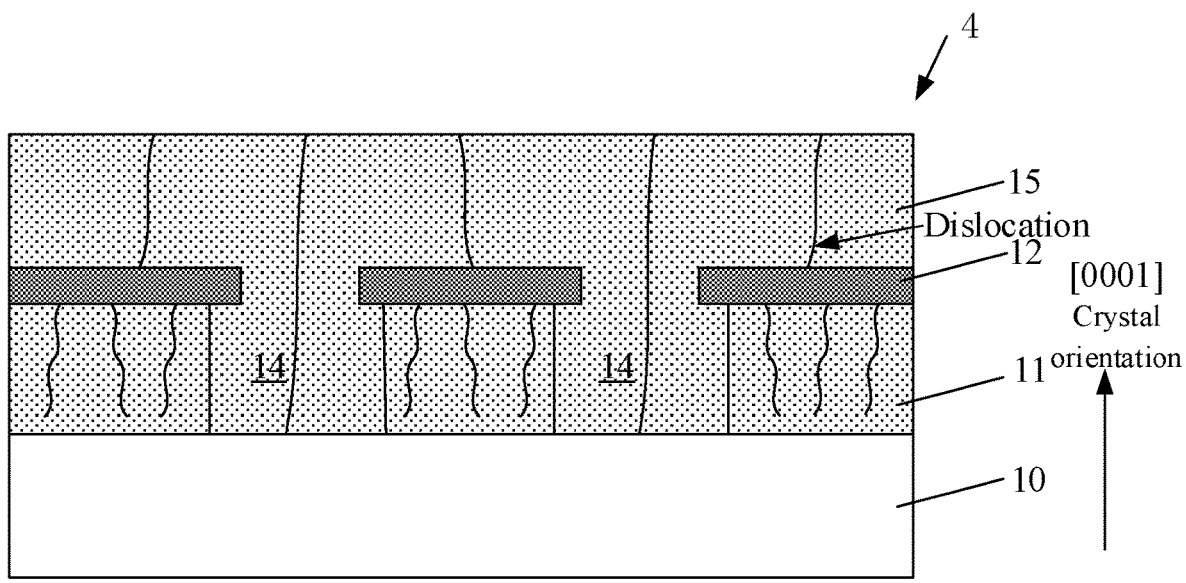
FIG. 10 is a schematic cross-sectional view illustrating a group-III-nitride structure according to a fourth embodiment of the present disclosure.

FIG. 9 is a schematic view illustrating an intermediate structure corresponding to a method of manufacturing a group-III-nitride structure according to a fourth embodiment of the present disclosure. FIG. 10 is a schematic cross-sectional view illustrating a group-III-nitride structure according to a fourth embodiment of the present disclosure. Referring to FIGS. 9 and 10, the group-III-nitride structure 4 and the manufacturing method thereof in the present embodiment are substantially the same as the group-III-nitride structure 1 and the manufacturing method thereof in the embodiments of FIGS. 1 to 5, and the difference merely lies in that, in step S1, the first group-III-nitride epitaxial layer 11 is etched through its thickness to form one or more grooves 11a.

In the present embodiment, since the bottom wall of the one or more grooves 11a exposes the substrate 10, the manufacturing process of the second mask layer 13 can be omitted, and the substrate 10 serves as the second mask layer 13.

The solutions of the present embodiment can also be combined with the solutions of the embodiment of FIG. 8, i.e., the second group-III-nitride epitaxial layer is an in-situ second group-III-nitride epitaxial layer 14', and the third group-III-nitride epitaxial layer 15 is an in-situ third group-III-nitride epitaxial layer 15'.

Figure 11:
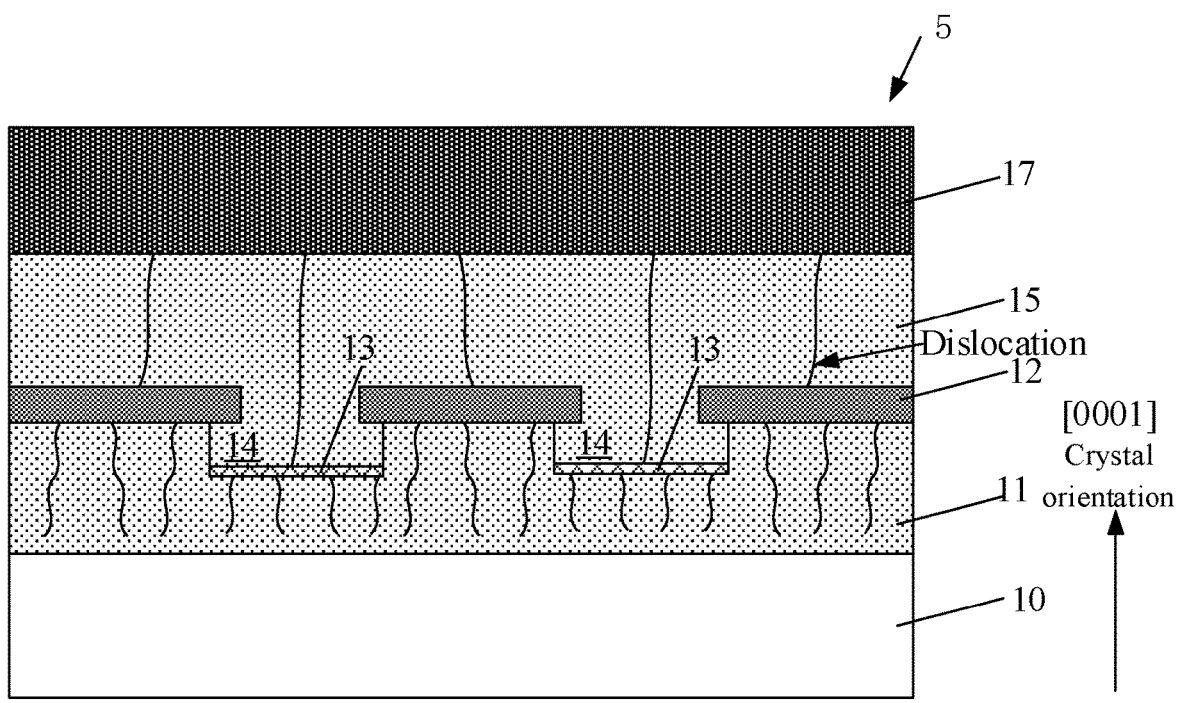
FIG. 11 is a schematic cross-sectional view illustrating a group-III-nitride structure according to a fifth embodiment of the present disclosure.

FIG. 11 is a schematic cross-sectional view illustrating a group-III-nitride structure according to a fifth embodiment of the present disclosure. Referring to FIG. 11, the group-III-nitride structure 5 and the manufacturing method thereof in the present embodiment are substantially the same as the group-III-nitride structures 1, 2, 3 and 4 and the manufacturing methods thereof in the embodiments of FIGS. 1 to 10, and the difference merely lies in that an LED structure 17 is grown and formed on the third group-III-nitride epitaxial layer 15.

The LED structure 17 can include an N-type semiconductor layer, a P-type semiconductor layer, and a quantum well layer between the N-type semiconductor layer and the P-type semiconductor layer.

The N-type semiconductor layer is configured to provide electrons, and the P-type semiconductor layer is configured to provide holes, so that electrons and holes combine in the quantum well layer to emit light. The N-type semiconductor layer and/or the P-type semiconductor layer can include a group-III-nitride material. The group-III-nitride material can be at least one of GaN, AlGaN, InGaN, or AlInGaN. N-type ions in the N-type semiconductor layer can be at least one of Si ions, Ge ions, Sn ions, Se ions, or Te ions. P-type doping ions in the P-type semiconductor layer can be at least one of Mg ions, Zn ions, Ca ions, Sr ions, or Ba ions.

In some embodiments, the N-type semiconductor layer can be adjacent to the third group-III-nitride epitaxial layer 15, and the P-type semiconductor layer is away from the third group-III-nitride epitaxial layer 15. In other embodiments, the P-type semiconductor layer can be adjacent to the third group-III-nitride epitaxial layer 15, and the N-type semiconductor layer can be away from the third group-III-nitride epitaxial layer 15.

The quantum well layer can be a single quantum well layer or a multi-quantum well layer.

The formation process of the LED structure 17 can refer to the formation process of the third group-III-nitride epitaxial layer 15.

Figure 12:
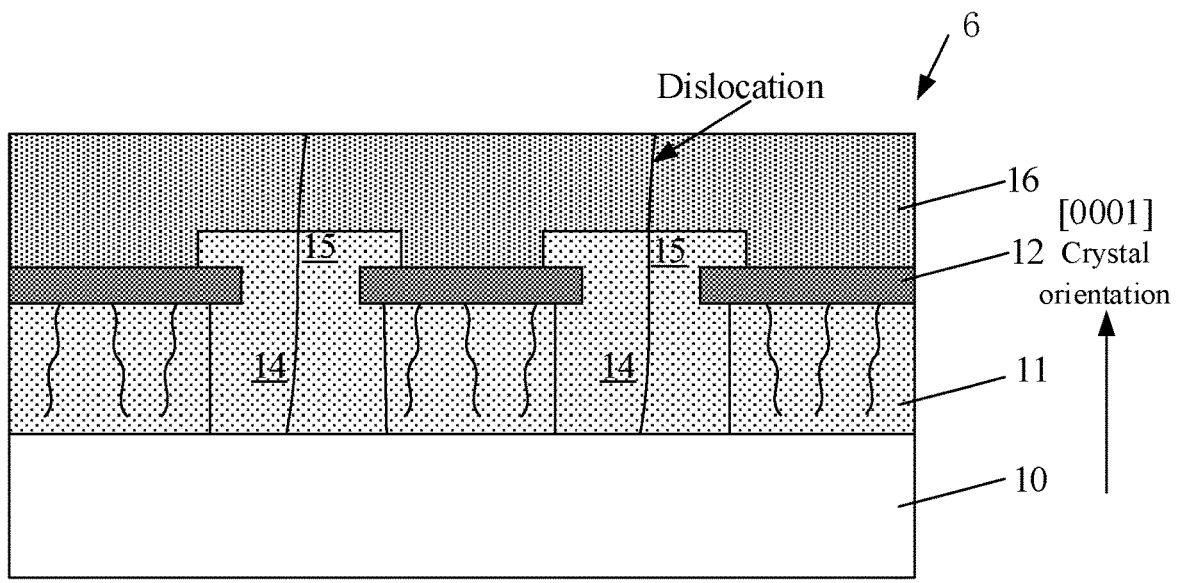
FIG. 12 is a schematic cross-sectional view illustrating a group-III-nitride structure according to a sixth embodiment of the present disclosure.

FIG. 12 is a schematic cross-sectional view illustrating a group-III-nitride structure according to a sixth embodiment of the present disclosure. Referring to FIG. 12, the group-III-nitride structure 6 and the manufacturing method thereof in the present embodiment are substantially the same as the group-III-nitride structures 1, 2, 3 and 4 and the manufacturing methods thereof in the embodiments of FIGS. 1 to 10, and the difference merely lies in that when the third group-III-nitride epitaxial layer 15 is not coalesced, a fourth group-III-nitride epitaxial layer 16 is further grown and formed on the patterned first mask layer 12 and the third group-III-nitride epitaxial layer 15.

A material of the fourth group-III-nitride epitaxial layer 16 is different from the material of the third group-III-nitride epitaxial layer 15.

Element types contained in the material of the fourth group-III-nitride epitaxial layer 16 are more than element types contained in the material of the third group-III-nitride epitaxial layer 15. For example, when the material of the third group-III-nitride epitaxial layer 15 is GaN, the element types contained in the fourth group-III-nitride epitaxial layer 16 further include at least one of Al or In. When the material of the third group-III-nitride epitaxial layer 15 is AlN, the element types contained in the fourth group-III-nitride epitaxial layer 16 at least include at least one of Ga or In.

The material of the fourth group-III-nitride epitaxial layer 16 can be at least one of AlGaN, InGaN, or AlInGaN.

With the solution of this embodiment, the stress in the fourth group-III-nitride epitaxial layer 16 can be effectively released, and the dislocation and V-shaped pits in the fourth group-III-nitride epitaxial layer 16 can be reduced. If the fourth group-III-nitride epitaxial layer 16 is formed by directly growing on the patterned first mask layer 12 and the second group-III-nitride epitaxial layer 14, V-shaped pits will be formed on the patterned first mask layer 12.

Figure 13:
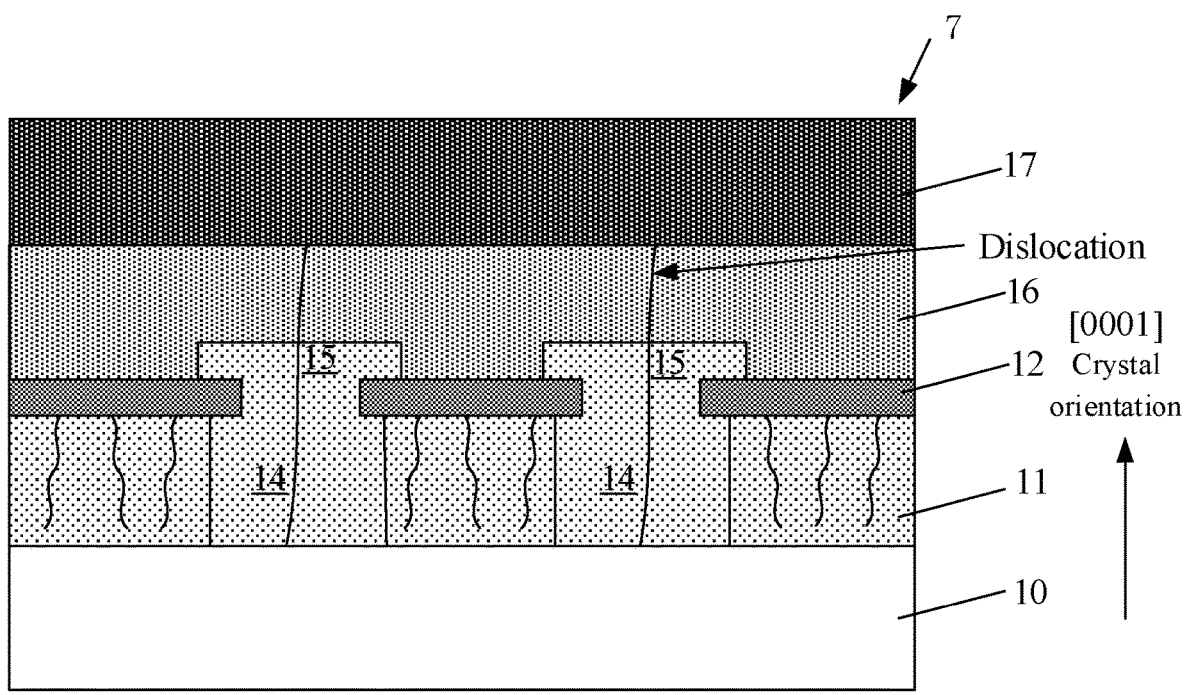
FIG. 13 is a schematic cross-sectional view illustrating a group-III-nitride structure according to a seventh embodiment of the present disclosure.

FIG. 13 is a schematic cross-sectional view illustrating a group-III-nitride structure according to a seventh embodiment of the present disclosure. Referring to FIG. 13, the group-III-nitride structure 7 and the manufacturing method thereof in the present embodiment are substantially the same as the group-III-nitride structure 6 and the manufacturing method thereof in the embodiment of FIG. 12, and the difference lies in that an LED structure 17 is further grown and formed on the fourth group-III-nitride epitaxial layer 16.

For the specific structure of the LED structure 17 and the formation method thereof, reference can be made to the specific structure of the LED structure 17 in the embodiment of FIG. 11 and the formation method thereof.

Although the present disclosure is disclosed as above, the present disclosure is not limited thereto. Any person skilled in the art will make various modifications and changes without departing from the spirit and scope of the present disclosure, and therefore the scope of protection of the present disclosure should be set forth by the appended claims.

The invention claimed is:

1. A method of manufacturing a group-III-nitride structure, comprising:
    providing a first group-III-nitride epitaxial layer; forming a patterned first mask layer on the first group-III-nitride epitaxial layer; and etching the first group-III-nitride epitaxial layer to form one or more grooves with the patterned first mask layer as a mask, wherein the patterned first mask layer has one or more suspended sections at the one or more grooves;
    forming a second mask layer at least on one or more bottom walls of the one or more grooves; and laterally growing and forming a second group-III-nitride epitaxial layer by performing a first epitaxial growth on the first group-III-nitride epitaxial layer with the second mask layer as a mask, wherein the one or more grooves are filled with the second group-III-nitride epitaxial layer; and
    growing and forming a third group-III-nitride epitaxial layer on the second group-III-nitride epitaxial layer and the patterned first mask layer by performing a second epitaxial growth on the second group-III-nitride epitaxial layer.

2. The method of manufacturing the group-III-nitride structure according to claim 1, wherein the first group-III-nitride epitaxial layer is located on a substrate,
etching the first group-III-nitride epitaxial layer to form the one or more grooves comprising:
etching an entire thickness of the first group-III-nitride epitaxial layer to form the one or more grooves, wherein the one or more bottom walls of the one or more grooves expose the substrate, and the substrate serves as the second mask layer.

3. The method of manufacturing the group-III-nitride structure according to claim 1, wherein the second mask layer is further formed on the patterned first mask layer, and the third group-III-nitride epitaxial layer is grown and formed on the second mask layer.

4. The method of manufacturing the group-III-nitride structure according to claim 1, wherein a material of the first group-III-nitride epitaxial layer, a material of the second group-III-nitride epitaxial layer and a material of the third group-III-nitride epitaxial layer are the same, and comprise at least one of GaN, AlN, AlGaN, InGaN or AlInGaN.

5. The method of manufacturing the group-III-nitride structure according to claim 1, wherein the processes for the epitaxial growth of the second group-III-nitride epitaxial layer and the third group-III-nitride epitaxial layer are the metal organic compound chemical vapor deposition method; and forming the second mask layer, and growing the second group-III-nitride epitaxial layer and the third group-III-nitride epitaxial layer are performed in a same metal organic compound chemical vapor deposition device.

6. The method of manufacturing the group-III-nitride structure according to claim 5, wherein etching to form the one or more grooves, forming the second mask layer, and growing the second group-III-nitride epitaxial layer and the third group-III-nitride epitaxial layer are performed in the same metal organic compound chemical vapor deposition device.

7. The method of manufacturing the group-III-nitride structure according to claim 1, wherein when the third group-III-nitride epitaxial layer on the patterned first mask layer is not coalesced, further growing and forming a fourth group-III-nitride epitaxial layer on the patterned first mask layer and the third group-III-nitride epitaxial layer.

8. The method of manufacturing the group-III-nitride structure according to claim 7, further comprising: growing an LED structure on the fourth group-III-nitride epitaxial layer.

9. The method of manufacturing the group-III-nitride structure according to claim 1, further comprising: growing an LED structure on the third group-III-nitride epitaxial layer.

10. The method of manufacturing the group-III-nitride structure according to claim 1, wherein a method of forming the first group-III-nitride epitaxial layer comprises: epitaxially growing the first group-III-nitride epitaxial layer on a substrate.

11. A group-III-nitride structure, comprising:
a first group-III-nitride epitaxial layer, wherein a patterned first mask layer is located on the first group-III-nitride epitaxial layer, a part of a thickness of the first group-III-nitride epitaxial layer is etched to form one or more openings with the patterned first mask layer as a mask, for each of the one or more openings, a size of an orthographic projection of a top of the opening onto a bottom plane of the opening is smaller than a size of the bottom plane of the opening, and the patterned first mask layer has one or more suspended sections at the one or more openings;
a second group-III-nitride epitaxial layer extending into the first group-III-nitride epitaxial layer from the one or more openings of the patterned first mask layer, wherein a second mask layer is provided between a bottom wall of the second group-III-nitride epitaxial layer and the first group-III-nitride epitaxial layer, and a sidewall of the second group-III-nitride epitaxial layer is connected with the first group-III-nitride epitaxial layer by lateral growth; and
a third group-III-nitride epitaxial layer located on the second group-III-nitride epitaxial layer and the patterned first mask layer, wherein [0001] crystal orientations of the first group-III-nitride epitaxial layer, the second group-III-nitride epitaxial layer and the third group-III-nitride epitaxial layer are parallel to a thickness direction.

12. The group-III-nitride structure according to claim 11, wherein a material of the first group-III-nitride epitaxial layer, a material of the second group-III-nitride epitaxial layer and a material of the third group-III-nitride epitaxial layer are the same, and comprise at least one of GaN, AlN, AlGaN, InGaN or AlInGaN.

13. The group-III-nitride structure according to claim 11, wherein the patterned first mask layer further has the second mask layer located thereon, and the third group-III-nitride epitaxial layer is located on the second mask layer.

14. The group-III-nitride structure according to claim 11, wherein a material of the first mask layer comprises at least one of silicon dioxide or silicon nitride; and/or a material of the second mask layer comprises at least one of silicon dioxide or silicon nitride.

15. The group-III-nitride structure according to claim 11, wherein the second group-III-nitride epitaxial layer is an in-situ second group-III-nitride epitaxial layer; and/or the second mask layer is an in-situ second mask layer.

16. The group-III-nitride structure according to claim 11, wherein the third group-III-nitride epitaxial layer located on the patterned first mask layer is not coalesced, and the patterned first mask layer and the third group-III-nitride epitaxial layer have a fourth group-III-nitride epitaxial layer located thereon.

17. The group-III-nitride structure according to claim 16, further comprising: an LED structure located on the fourth group-III-nitride epitaxial layer.

18. The group-III-nitride structure according to claim 11, further comprising: an LED structure located on the third group-III-nitride epitaxial layer.

19. A group-III-nitride structure, comprising:
a substrate,
a first group-III-nitride epitaxial layer located on the substrate, wherein a patterned first mask layer is located on the first group-III-nitride epitaxial layer, an entire thickness of the first group-III-nitride epitaxial layer is etched to form one or more openings with the patterned first mask layer as a mask, for each of the one or more openings, a size of an orthographic projection of a top of the opening onto the substrate is smaller than a size of a bottom plane of the opening, and the patterned first mask layer has one or more suspended sections at the one or more openings;
a second group-III-nitride epitaxial layer extending into the first group-III-nitride epitaxial layer from the one or more openings of the patterned first mask layer, wherein a bottom wall of the second group-III-nitride epitaxial layer is directly contact with the substrate, and a sidewall of the second group-III-nitride epitaxial layer is connected with the first group-III-nitride epitaxial layer by lateral growth; and
a third group-III-nitride epitaxial layer located on the second group-III-nitride epitaxial layer and the patterned first mask layer, wherein [0001] crystal orientations of the first group-III-nitride epitaxial layer, the second group-III-nitride epitaxial layer and the third group-III-nitride epitaxial layer are parallel to a thickness direction.

* * * * *